(12) United States Patent
Novak et al.

(10) Patent No.: US 6,815,695 B2
(45) Date of Patent: Nov. 9, 2004

(54) SIMPLIFIED RETICLE STAGE REMOVAL SYSTEM FOR AN ELECTRON BEAM SYSTEM

(75) Inventors: W. Thomas Novak, Hillsborough, CA (US); Douglas C. Watson, Campbell, CA (US)

(73) Assignee: Nikon Corporation, Tokyo (JP)

( * ) Notice: Subject to any disclaimer, the term of this patent is extended or adjusted under 35 U.S.C. 154(b) by 108 days.

(21) Appl. No.: 10/056,017

(22) Filed: Jan. 28, 2002

(65) Prior Publication Data

US 2003/0141461 A1 Jul. 31, 2003

(51) Int. Cl.$^7$ .............................................. H01L 21/00
(52) U.S. Cl. ............................... 250/492.2; 250/492.3; 250/492.21; 250/492.22; 438/4; 257/678
(58) Field of Search ........................... 250/492.2, 492.3, 250/492.21, 492.22, 396 HL; 438/4; 257/678; 355/53

(56) References Cited

PUBLICATIONS

T. Shigaraki, "Semiconductor Manufacturing Apparatus and Method of Manufacturing Semiconductor Devices", Pub. No.: 2002/0006675 A1, publication date: Jan. 17, 2002.*

Y. Miwa, "Exposure Apparatus and Exposure Method", Pub. No.: 2002/0071105 A1, publication date: Jun. 13, 2002.*

K. Hattori et al. "Exposure Apparatus, Hol;der Container, Device manufacturing Method, and Device Manufacturing Unit", Pub. No.: 2002/0074635 A1, publication date: Jun. 20, 2002.*

* cited by examiner

Primary Examiner—John R. Lee
Assistant Examiner—Zia R. Hashmi
(74) Attorney, Agent, or Firm—Whitham, Curtis & Christofferson, P.C.

(57) ABSTRACT

A simplified reticle removal system used with an electron beam system. The simplified reticle removal system includes a reticle chamber having an angled opening and a maintenance panel removably or pivotably attached thereto. The angled opening provides access to a reticle stage housed within the reticle chamber. The angled opening further permits removal of the reticle stage from the reticle chamber without having to disassemble and remove the optics system of the electron beam system. This reduces maintenance and repair costs, as well as reduces down time of the electron beam system.

19 Claims, 5 Drawing Sheets

SIMPLIFIED RETICLE STAGE REMOVAL SYSTEM FOR AN ELECTRON BEAM SYSTEM

BACKGROUND OF THE INVENTION

1. Field of the Invention

The present invention generally relates to a lithography system and, more particularly, to a simplified reticle stage removal system for an electron beam system.

2. Background Description

Lithographic processes are typically used to manufacture memory, logic and other types of semiconductor devices. In one type of lithographic process, a medium such as light or non-visible radiation (e.g., DUV or a charged particle beam) is projected through a reticle (or mask) to pattern a resist on a wafer to allow selective processing. In most conventional systems, the reticle is positioned by a stage which supports the reticle.

Accurately positioning the reticle is important in the semiconductor fabrication process. This accurate positioning allows the desired pattern to be transferred from the reticle to the wafer. This pattern may be, for example, used to fabricate an array of many electric devices. Conventional reticle stages provide relatively precise motion in the X-axis and Y-axis directions, and sometimes slight motion in the vertical (Z-axis) direction. A reticle stage is generally used when the reticle is scanned to facilitate compensation of aberration. Conventional stages attempt, with varying degrees of success, to provide as smooth and precise scanning motion as possible, and accurate reticle to wafer alignment. Conventional systems currently have positional resolution capabilities of about 40 nm, which may be more limited than desired.

The reticle stage has typically been two dimensional. For instance, two-dimensional stages have been developed in which force generating elements of the stage assembly are supported by a reaction frame independent from the electron beam or optical column and from the weight of the reticle stage plate. (See, U.S. Pat. No. 6,130,490 to Lee). Also, reticle stage technology has developed based on the recognition that the guide structure that was located directly under the reticle stage, in early reticle stage designs, interferes with directing light or an e-beam, and may cause degradation of position resolution and a source of transmitted vibration through the reticle and through the stage to the underlying projection lens. Hence, efforts began to remove the guides and so-called "guideless reticle stages" have been developed. It is further noted that a third degree of reticle stage technology has been proposed. (See, U.S. Pat. No. 6,147,421, to Takita et al.) In this type of system, a platform is positionable in at least three degrees of freedom by using a system of multiple magnets and multiple coils.

Additional features also merit attention when designing a reticle stage and other sub systems of the lithography system. For example, throughput in a lithography system is a feature of interest, as is accuracy to support economy of manufacture as well as quality and high manufacturing yield. Additionally, some conventional reticle stages suffer from a problem that external forces and/or small reaction forces adversely affect the performance of the stage; namely, forces can cause vibration and body distortion which highly affect the tracking error of the stage. Meanwhile, another feature to consider in a reticle stage is maximizing servo bandwidth because this results in faster response to correct and reduce errors caused by disturbances from the ideal position and velocity. Also, avoiding distortion to the stage base and frame is also an important consideration because such distortion may not be directly measurable by the metrology system (laser interferometers) and can result in an uncompensated error.

Another desirable feature of lithography systems is the periodic access and removal of the reticle stage for maintenance such as cleaning, replacement and the like. This is very important due to the fact that the reticle is subject to heating, high currents and other erosive factors within the vacuum chamber. These many environmental factors such as vibrations and body distortions subject the reticle stage as well as reticle table to misalignments and other accuracy considerations. However, current lithography systems provided for relatively cumbersome and complex removal of the reticle stage. These systems also do not provide and easy access to the reticle stage. By way of illustration, FIG. 1 shows a highly schematic view of a conventional lithography system with a cumbersome and complex removal system. In the system shown in FIG. 1, a reticle table (RT) is mounted to a reticle stage (RS) and is positionable between the projection optics (PO) and illuminator optic (IO). The conventional chamber parting line, designated as "p", is representative of a split of the vacuum chamber.

In order to remove the reticle stage in the system of FIG. 1, the reticle stage must be removed in the removal direction of $Dir_0$, perpendicular to the plane of the reticle table. However, to accomplish this removal, the illuminator optics (IO) and the entire upper casing of the lithography system must be disassembled. This is mainly due to the fact that the illuminator optics, due to the design of current systems, is supported by the upper casing of the lithography system. Then, to reinstall the reticle stage, the illuminator optics and the entire upper casing or part of the lithography system must be reassembled and realigned after the reticle stage is installed into the system. This procedure is complex and costly. It also requires a substantial amount of down time of the lithography system, which could otherwise be used for the further fabrication of semiconductor devices. Also, such a removal system requires a realignment of the reticle stage as well as the illuminator optics and other subsystems, all very costly and time consuming procedures. Additionally, there is no convenient access to the reticle stage for periodic maintenance or other minor repairs or adjustments. In summary, the above difficulties present a trade-off between maintenance and throughput such that both lithographic exposure and economy are adversely affected.

SUMMARY OF THE INVENTION

In a first aspect of the invention, a lithography system has a reticle chamber having a reticle chamber opening. A reticle chamber maintenance panel is removably mounted to the reticle chamber opening. The reticle chamber maintenance panel may be pivotably mounted to the chamber and the opening may be at an angle such as, for example, between 0° and 45°, or other such angle. A reticle stage is housed within the reticle chamber and is substantially completely accessible and removable through the reticle chamber opening. In embodiments, the reticle stage is removable from the reticle chamber in a first direction which is in a plane substantially horizontal to a reticle table mounted to the reticle stage. In further embodiments, a projection optic system and an illuminator optic system are mounted to the body structure, and do not have to be removed or disassembled when the reticle stage is accessed or removed. The reticle chamber opening provides access to substantially a center of gravity of the reticle stage.

In still another aspect of the present invention, the lithography system includes a reticle chamber having a reticle chamber angled opening and a reticle chamber maintenance panel which is removably mounted to the reticle chamber angled opening. An optical system for illuminating and projecting a source on a reticle is also provided. A reticle stage having a reticle table is positioned within the reticle chamber. The reticle table may be positioned between components of the optical system. In embodiments of this aspect, the reticle chamber angled opening provides access to substantially a center of gravity of the reticle stage, and permits removal of the reticle stage without removing the optical system. The reticle stage may be removable from the reticle chamber via the reticle chamber angled opening in a first direction which is in a plane substantially horizontal to the reticle table.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention is directed to a simplified removal system for a reticle stage in lithography manufacturing equipment. The inventive simplified stage removal system may operate within a narrow gap (such as 60 mm) between the illuminator section and projection section of an electron beam system of the lithography manufacturing equipment. The removal system for the reticle stage does not require the disassembly of the illuminator optics or the entire upper portion of the lithography manufacturing equipment. Instead, the removal system provides a simplified procedure which reduces assembly and disassembly time as well as down time for the fabricating process, and which allows easy access and/or removal thereof for maintenance, repair or replacement without causing excessive downtime.

Figure 1:
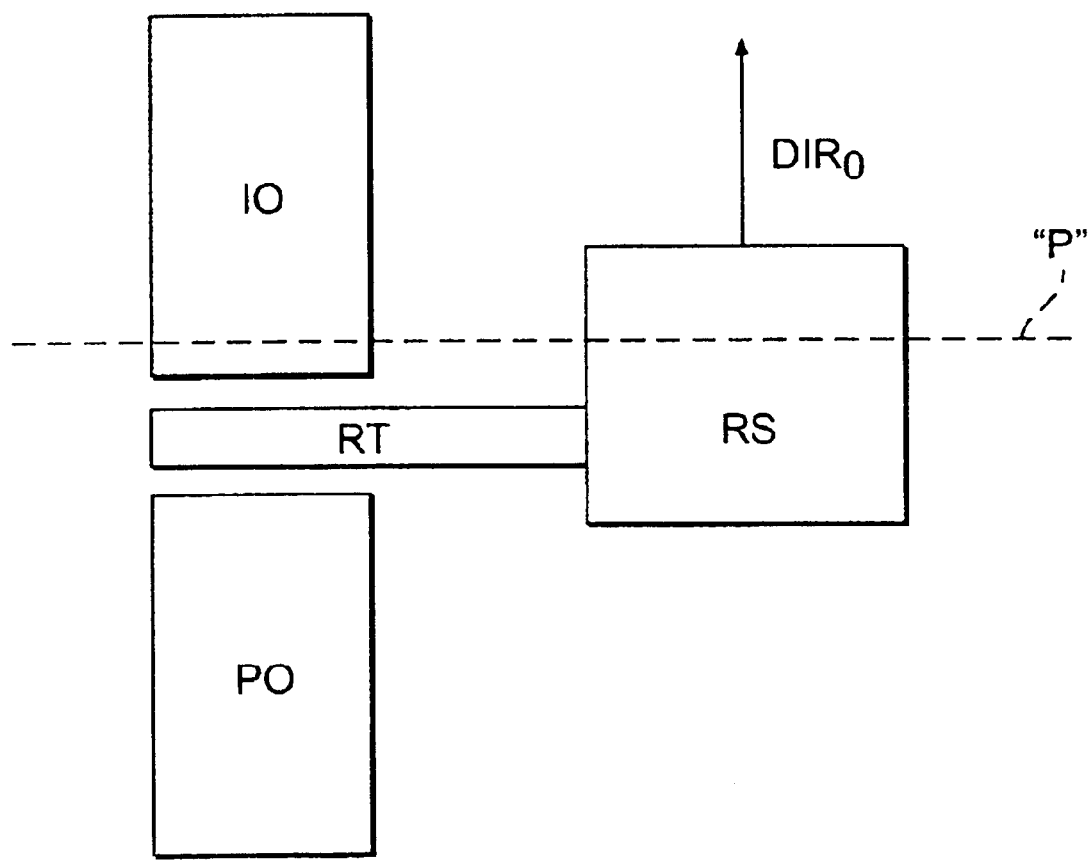
FIG. 1 is a highly schematic view of a conventional lithography system.
Figure 2:
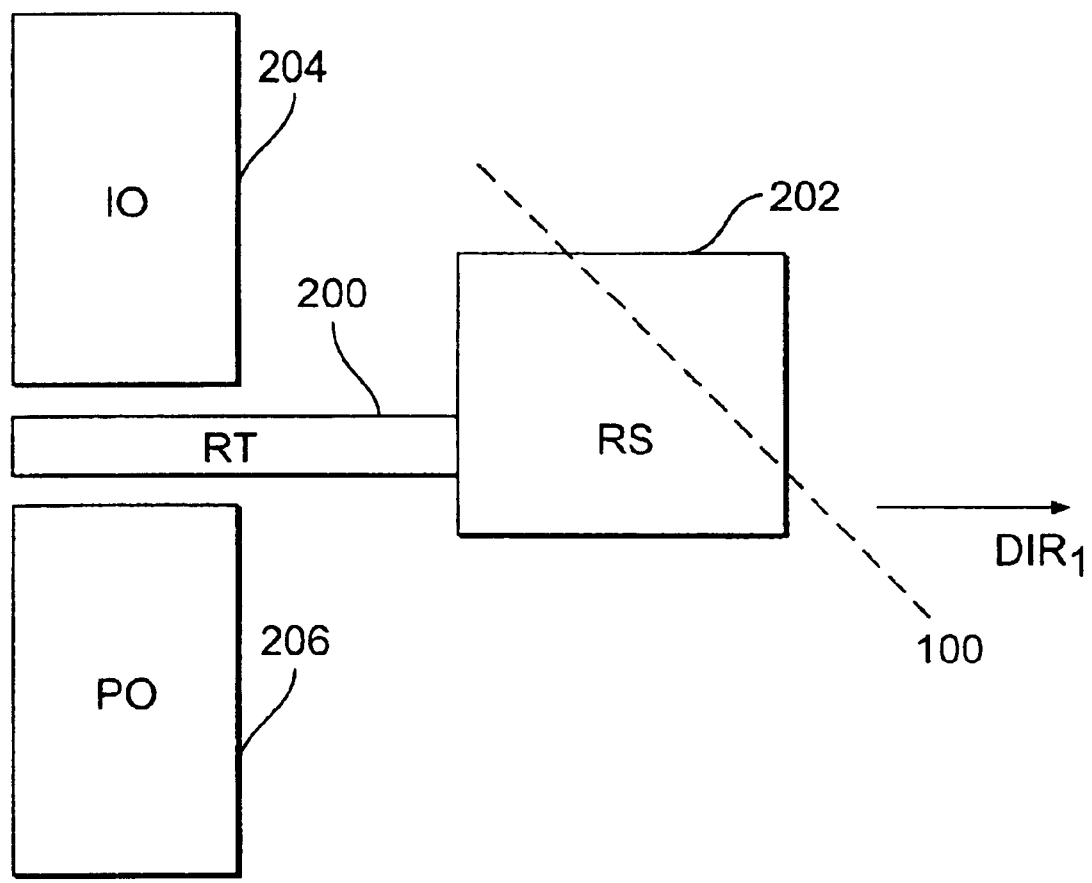
FIG. 2 is a highly schematic view of the lithography system of the present invention.

Referring now to the drawings, and more particularly to FIG. 2, there is shown a highly schematic view of the lithography system of the present invention. In the embodiments of the present invention, the lithography system is a lithography apparatus which includes a reticle table 200 cantilevered or mounted to a reticle stage 202. The reticle table 200, as in most conventional systems, is positionable between an illuminator optics system 204 and projection optics system 206. In the system of the present invention, the chamber parting line 100 may, in embodiments, be provided at an angle of between 0° (to the vertical) to upwards of more than 45° relative to the reticle stage 202. By having the parting line within this angle range, the reticle stage 202 may be advantageously accessed and removed in the direction of $Dir_1$ without removing or disassembling the illuminator optics 204 or the entire upper portion of the system. This saves disassembly and assembly time and costs, as well as maintains the alignment and accuracy of the illuminator optics system and other subsystems within the lithography system of the present invention.

Figure 3:
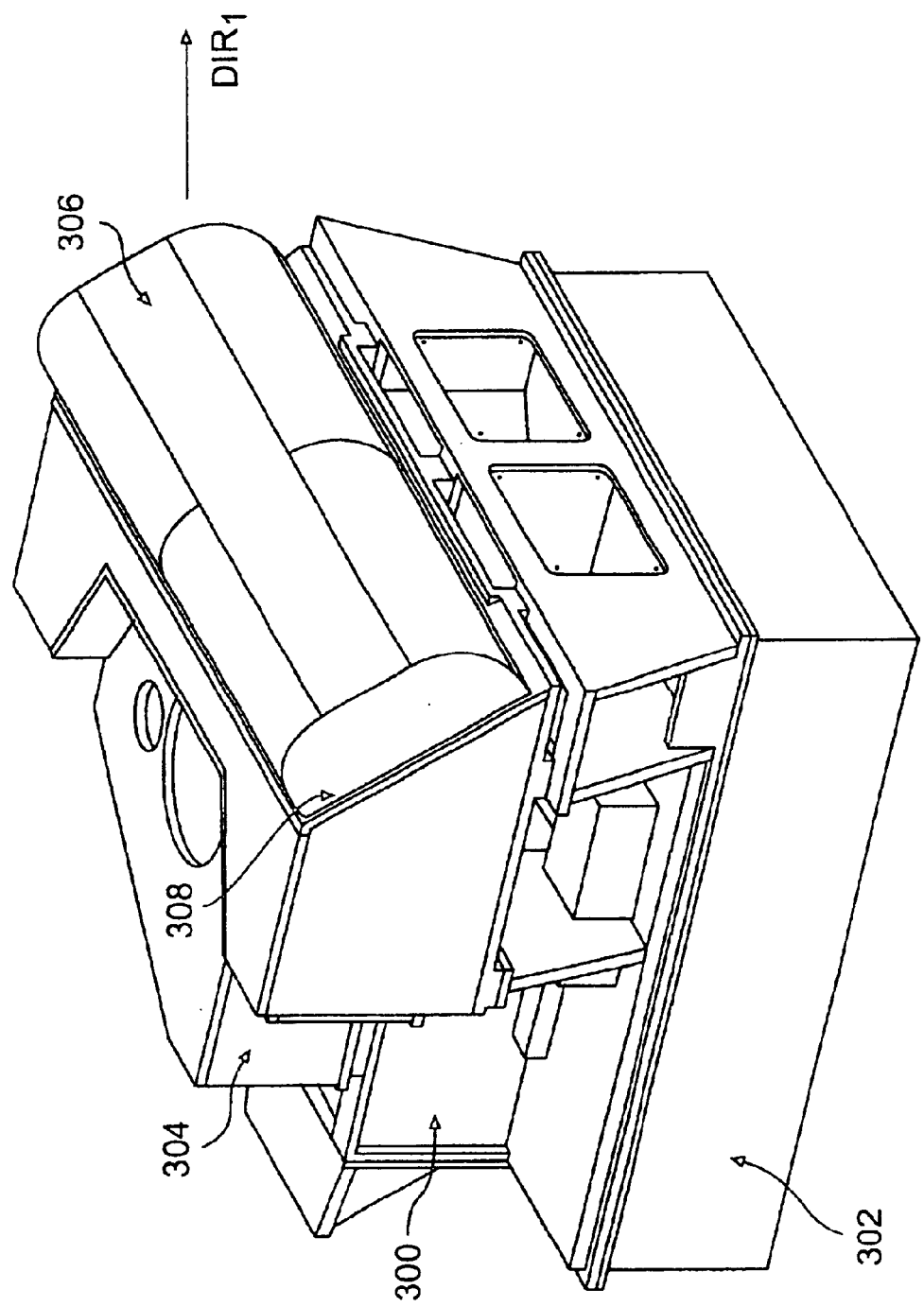
FIG. 3 is a perspective view of an exemplary lithography system of the present invention.
Figure 4:
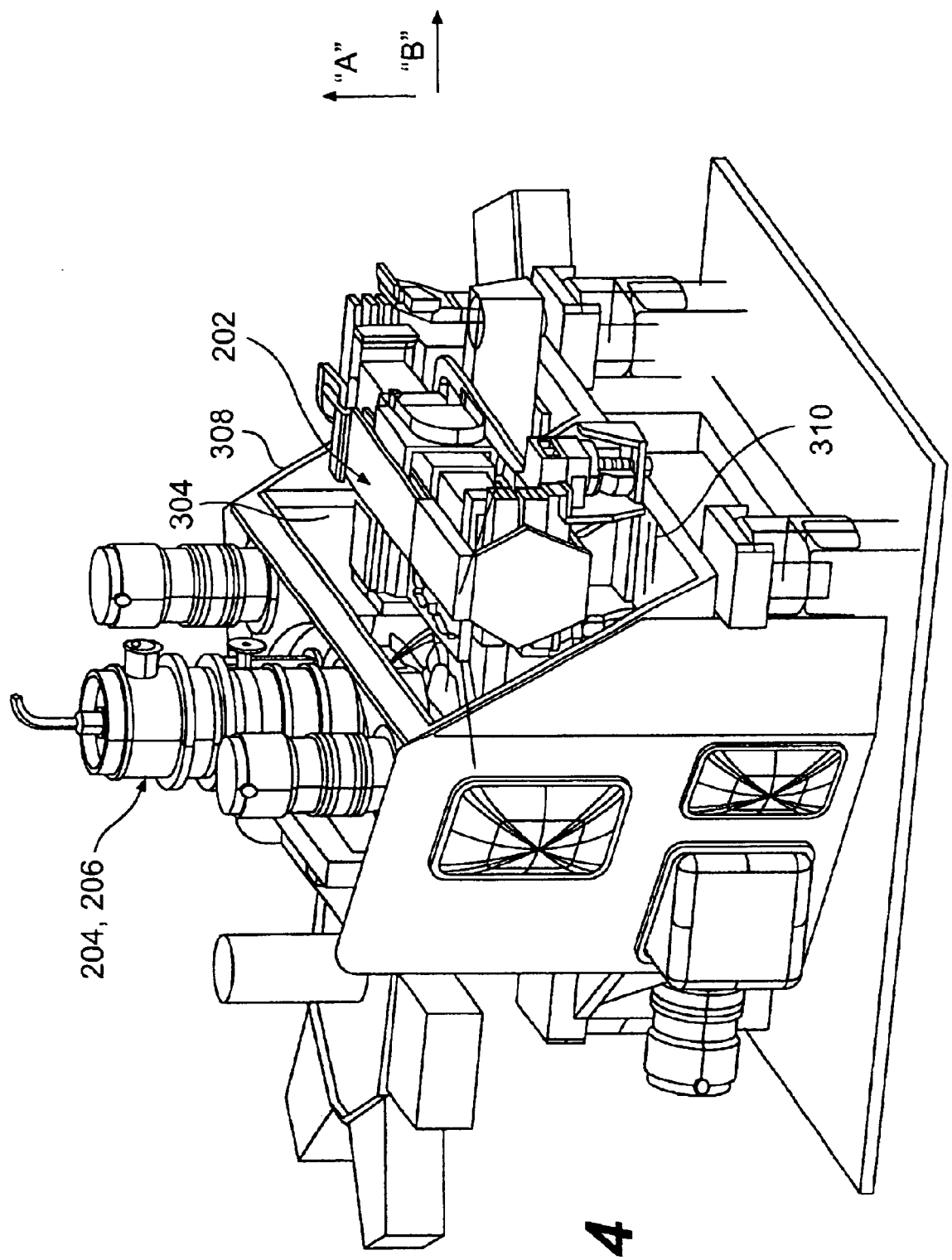
FIG. 4 is an internal perspective view of the exemplary lithography system of the present invention.
Figure 5:
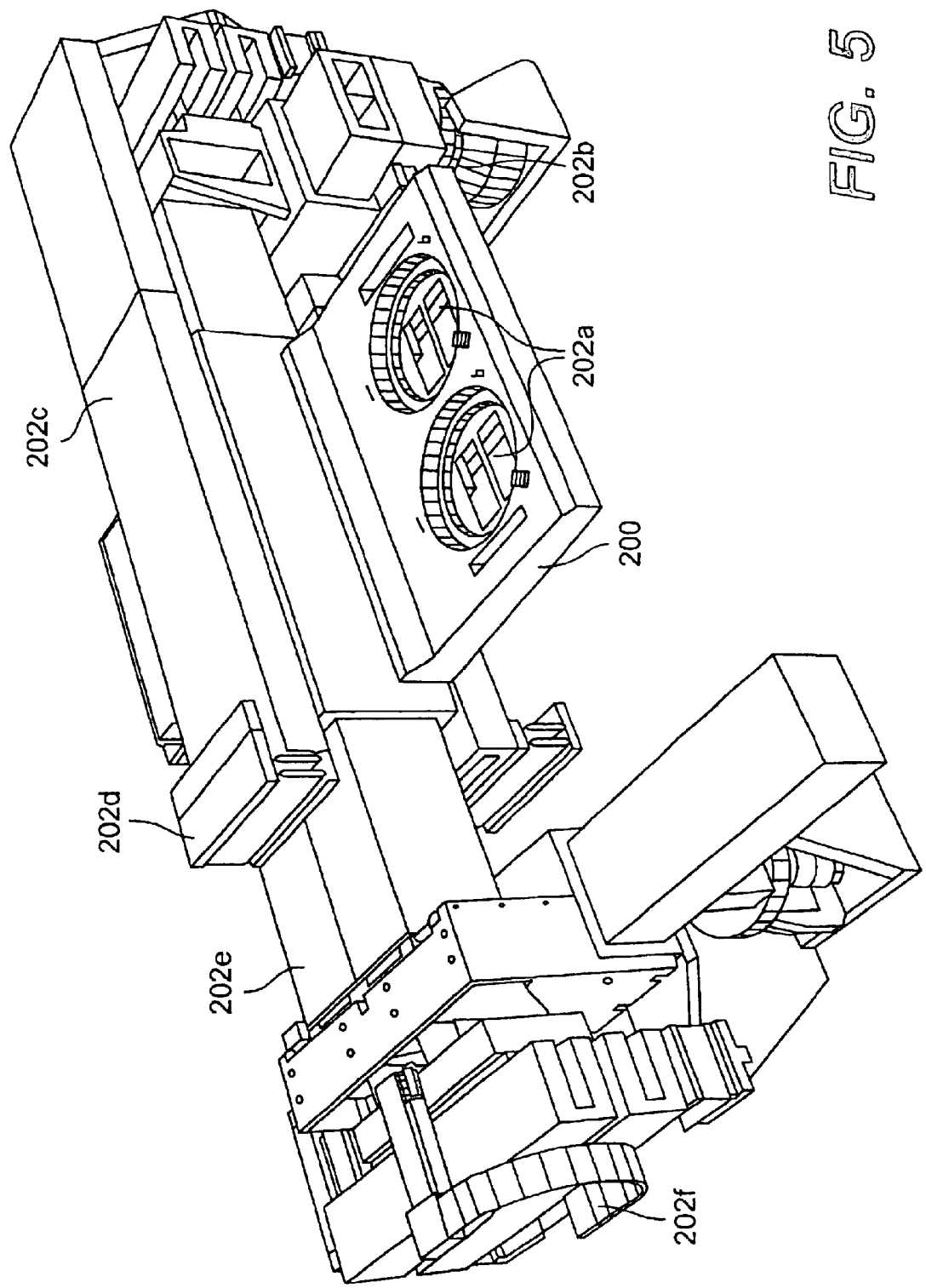
FIG. 5 is a perspective view of an exemplary reticle table and stage removed from the lithography system of the present invention.

FIGS. 3–5 show a perspective view of an exemplary lithography system of the present invention. It is noted that the inventive concepts of the present invention may equally be adapted to other lithography systems; however, for illustrative purposes, the present disclosure is directed to the lithography system of FIGS. 3–5. Accordingly, the inventive stage removal system of the present invention is not limited in any manner to the use of the lithography system of FIGS. 3–5, but may equally be used with other lithography systems.

The lithography system of FIG. 3 shows a central body structure 300. A wafer stage chamber 302 is mounted to a lower portion of the central body structure 300 and a reticle stage chamber 304 is mounted to an upper portion of the central body structure 300. The reticle stage chamber 304 includes a vacuum chamber which may have pressures of upwards of 14.7 PSI (approximately 1 ton/ft$^2$). The reticle chamber 304 includes a reticle chamber maintenance panel 306 which is removable or pivotably mounted to a chamber angled opening 308. The reticle chamber maintenance panel 306 is, in embodiments, comprised of a curved shaped (preferably semi cylindrical) in order to better withstand the pressures within the vacuum chamber. That is, the curved shape of the reticle chamber maintenance panel 306 may be stiffer than a flat panel, and may also have a thinner wall structure. It is noted, however, that the panel may also be a flat panel, but in such a configuration, the vacuum chamber should be larger in order to accommodate the reticle stage 202 housed therein.

As to the chamber angled opening 308, the angle should preferably range from 0° (from the vertical) to upwards of approximately 45°. The angle may also be greater than 45°, in embodiments. It is noted that the chamber angled opening 308 substantially represents the angled chamber parting line 100 of FIG. 2 which provides an opening for substantially complete access to and, in embodiments, removal (or installation) of the reticle table 200 and reticle stage 202 without removing the illuminator optics and the upper casing of the lithography system. The access or removal of the reticle stage is provided in order to perform maintenance, repair and/or replacement thereon.

As to the removal of the reticle stage 202, it is also noted that the access opening created by the chamber angled opening 308 allows access to the reticle stage 202 at substantially the center of gravity for easy removal of the reticle stage 202. That is, the access opening allows the reticle stage 202 to be easily removed in the direction of $Dir_1$, which is substantially horizontal to and in the same plane as the reticle chamber 304 or the reticle table 200. The direction of $Dir_1$ is also substantially perpendicular to a source illuminated from the illuminator optic system 204 and projected through the projection optics system 206.

FIG. 4 shows an internal perspective view of the exemplary lithography system of the present invention. In this perspective view, the reticle chamber maintenance panel 306 is removed from the reticle stage chamber 304 and more specifically from the chamber angled opening 308. FIG. 3 further shows the reticle stage 202 partly removed from the reticle stage chamber 304. As further shown, the removal of the reticle chamber maintenance panel 306, in combination with the angled opening 308, allows easy access to the reticle stage 202 in order to make any adjustments, repairs and the like thereto without removing the reticle stage 202 from the reticle chamber 304. Also, the illuminator optics 204 and the projection optics 206 are mounted to the central body structure 300. This provides a robust support for the illuminator optics 204 and the projection optics 206.

To remove the reticle stage 202, the reticle stage 202 is lifted slightly up in the direction of arrow "A" and then horizontally in the direction of arrow "B" through the chamber angled opening 308. In embodiments, the lifting and sliding is performed at substantially the center of gravity of the reticle stage 202. In further embodiments, the reticle stage 202 may be set on tracks 310 which allows the reticle stage 202 to be slid in the direction of $Dir_1$, towards the rear of the lithography system without the lifting of the reticle stage 202. It should be understood by those of ordinary skill in the art that the reticle stage 202 may be completely removed from the reticle chamber 304 for maintenance, replacement or repair without the need for removal of either the illuminator optics 204 or the protection optics 206. This minimizes replacement, assembly and other costs, as well as reduces down time of the lithography system of the present invention.

FIG. 5 shows the reticle stage 202 and reticle table 200 removed from the lithography system in the manner described above. The reticle stage 202 and table 200 shown in FIG. 5 is provided for illustrative purposes and is simply an exemplary embodiment which can be used with the removal system of the present invention. To this end, the reticle stage 202 includes reticles 202a, at least one "Z" support and actuator 202b, at least one "Y" linear motor 202c, a motor support mechanism 202d, a moving guide 202e and a cable loop 202f, amongst other features well known in the art. Any combination of these features may be used with the reticle stage for removal or access with the removal system of the present invention.

While the invention has been described in terms of a single preferred embodiment, those skilled in the art will recognize that the invention can be practiced with modification within the spirit and scope of the appended claims.

Having thus described our invention, what we claim as new and desire to secure by Letters Patent is as follows:

1. A lithography system, comprising:
 a reticle chamber containing a reticle stage component extending between portions of an optics system,
 said reticle chamber having a reticle chamber opening that provides direct access to said reticle stage within said reticle chamber so that said reticle stage can be accessed or removed through said reticle chamber opening and from between said portions of said optics system without disassembly of components of said optics system.

2. The lithography system of claim 1, wherein said reticle stage component includes a reticle stage and a reticle table, wherein said reticle stage component is removable from said reticle chamber in a first direction which is in a plane substantially horizontal to said reticle table mounted to said reticle stage.

3. The lithography system of claim 1, wherein said reticle chamber opening is at an angle substantially equal to or between 0° and 45° with relation to said reticle chamber.

4. The lithography system of claim 1, wherein said reticle chamber opening is at an angle at or greater than 45° with relation to said reticle chamber.

5. The lithography system of claim 1, wherein said optics system comprises:
 a projection optic system; and
 an illuminator optic system;
 wherein said reticle table mounted to said reticle stage positionable between said projection optic system and said illuminator optic system.

6. The lithography system of claim 5, wherein said reticle table and said reticle stage are removable through said reticle chamber opening in a plane which is substantially perpendicular to a source illuminating from said illuminator optic system.

7. The lithography system of claim 5, further comprising a body structure which is mounted to a lower portion of the reticle chamber, said projection optic system and said illuminator optic system being mounted to said body structure.

8. The lithography system of claim 1, wherein said reticle chamber opening provides access to substantially a center of gravity of said reticle stage.

9. The lithography system of claim 1, further comprising a reticle chamber maintenance panel,
 wherein said reticle chamber maintenance panel is removably mounted to said reticle chamber over said reticle chamber angled opening.

10. The lithography system of claim 9, wherein said reticle chamber maintenance panel is pivotably mounted to said reticle chamber.

11. The lithography system of claim 9, wherein said reticle chamber maintenance panel is semi-cylindrically shaped.

12. A lithography system, comprising:
 a reticle chamber having a reticle chamber angled opening,
 a reticle chamber maintenance panel which is removably mounted to the reticle chamber over said reticle chamber angled opening;
 an optical system for illuminating and projecting a source;
 a reticle stage having a reticle table, said reticle table positioned between components of said optical system and housed with said reticle stage within said reticle chamber,
 wherein said reticle chamber angled opening provides access to said reticle stage.

13. The lithography system of claim 12, wherein said reticle chamber angled opening provides access to said reticle stage at substantially a center of gravity.

14. The lithography system of claim 13, wherein said reticle stage is removable from said reticle chamber via said reticle chamber angled opening.

15. The lithography system of claim 13, wherein said reticle stage is removable from said reticle chamber via said reticle chamber angled opening in a first direction which is in a plane substantially parallel to the reticle table.

16. The lithography system of claim 15, wherein said reticle chamber angled opening is at an angle of approximately 45° with relation to said reticle chamber such that said reticle chamber maintenance panel is removed, said reticle stage partially extends from said reticle chamber.

17. The lithography system of claim 16, wherein said reticle chamber maintenance panel is pivotably mounted to the reticle chamber.

18. The lithography system of claim 16, wherein said reticle chamber maintenance panel is semi-cylindrically shaped.

19. The lithography system of claim 15, further comprising a body structure which is mounted to a lower portion of said reticle chamber, said projection optic and said illuminator optic being mounted to said body structure during the removal of said reticle table and said reticle stage.

* * * * *